(12) United States Patent
Lee

(10) Patent No.: US 6,933,213 B2
(45) Date of Patent: Aug. 23, 2005

(54) METHOD FOR FABRICATING GROUP III-V COMPOUND SEMICONDUCTOR SUBSTRATE

(75) Inventor: Kyo-yeol Lee, Kyungki-do (KR)

(73) Assignee: Samsung Corning Co., Ltd., Suwon (KR)

(*) Notice: Subject to any disclaimer, the term of this patent is extended or adjusted under 35 U.S.C. 154(b) by 123 days.

(21) Appl. No.: 10/086,892

(22) Filed: Mar. 4, 2002

(65) Prior Publication Data

US 2002/0123157 A1 Sep. 5, 2002

(30) Foreign Application Priority Data

Mar. 5, 2001 (KR) ......................................... 2001-11153

(51) Int. Cl.[7] .............................................. H01L 21/20
(52) U.S. Cl. ............................................................ 438/478
(58) Field of Search ............................... 438/29, 33, 46, 438/68, 455, 458, 459, 464, 478

(56) References Cited

U.S. PATENT DOCUMENTS

| | | | | | |
|---|---|---|---|---|---|
| 5,290,393 A | * | 3/1994 | Nakamura | .................. | 438/509 |
| 5,847,409 A | * | 12/1998 | Nakayama | .................... | 257/15 |
| 5,905,275 A | * | 5/1999 | Nunoue et al. | ................ | 257/95 |
| 5,927,995 A | * | 7/1999 | Chen et al. | .................. | 438/517 |
| 5,985,687 A | * | 11/1999 | Bowers et al. | ................. | 438/46 |

FOREIGN PATENT DOCUMENTS

| | | | | |
|---|---|---|---|---|
| JP | A-3-161922 | | 7/1991 | |
| JP | 2000-105321 | * | 4/2000 | ........... H01L/33/00 |

* cited by examiner

*Primary Examiner*—Craig A. Thompson
(74) *Attorney, Agent, or Firm*—Burns, Doane, Swecker & Mathis, LLP

(57) ABSTRACT

Provided is a compound semiconductor substrate fabrication method involving: preparing a base substrate; forming a first buffer layer on the prepared base substrate; forming a semiconductor layer on the first buffer layer; and removing the base substrate.

40 Claims, 5 Drawing Sheets

METHOD FOR FABRICATING GROUP III-V COMPOUND SEMICONDUCTOR SUBSTRATE

Priority is claimed to Patent Application Number 2001-11153 filed in the Republic of Korea on Mar. 5, 2001 herein incorporated by reference.

BACKGROUND OF THE INVENTION

1. Field of the Invention

The present invention relates to a method of semiconductor substrate fabrication, and more particularly, to a method of Group III–V compound substrate fabrication.

2. Description of the Related Art

The performance and lifetime of semiconductor devices such as laser diodes or light-emitting diodes are determined by their constituents and are greatly influenced by base substrates on which devices are integrated. Many approaches to manufacture high-quality semiconductor substrates have been made. With an increasing interest in Group III–V compound semiconductor substrates, the fabrication of a GaN substrate, which represents the Group III–V compound semiconductor substrate, has received considerable attention in recent years.

The key to fabricate a high-quality GaN substrate is to reduce the defect density in the GaN substrate. Also, the overall fabrication process should be simplified at low cost.

A general method of GaN substrate fabrication involves growing a GaN layer on a sapphire substrate and removing the sapphire substrate. As the thickness of the GaN layer grown on the sapphire substrate increases, the defect density in the GaN layer tends to decrease. For this reason, there is a need to grow the GaN layer on the sapphire substrate as thick as possible.

A hydride vapor phase epitaxy (HVPE) method, which has a relatively high growing rate, sublimation method, and metal organic chemical vapor deposition method are effective to grow a thick GaN layer on a sapphire substrate. However, the MOCVD method has too slow a film growing rate to grow a GaN layer having a thickness of tens of micrometers to a few hundred micrometers although it provides a high-quality GaN layer.

In a conventional method of fabricating a GaN substrate by HVPE, a silicon oxide layer is formed on a sapphire substrate as a mask, and a GaN layer is grown thereon by epitaxial lateral overgrowth (ELO) (referred to as a "first method" below). Alternatively, as shown in FIG. 1, a thick GaN layer 12 is directly grown on a sapphire substrate 10 without using a mask (referred to as a "second method" below).

In the first method, it is difficult to form a wide, thick GaN layer because stress is unevenly exerted on the GaN layer grown on the sapphire substrate. In the second method, because the sapphire substrate 10 and the GaN layer 12 have different thermal expansion coefficients, stresses act on the sapphire substrate 10 and the GaN substrate 12 in different directions, as shown in FIG. 2. In FIG. 2, reference numeral 10a denotes a tensile stress in the sapphire substrate 10, and reference numeral 12a denotes a compressive stress in the GaN layer 12, which acts in an opposite direction to the tensile stress. These stresses acting in opposite patterns cause cracks in the sapphire substrate 10 and the GaN layer 12. The GaN layer 12 is doped with silicon for conductivity. Accordingly, the GaN layer 12 is susceptible to crack due to the internal stress caused by silicon doping.

SUMMARY OF THE INVENTION

To solve the above-described problems, it is an object of the present invention to provide a method for fabricating a Group III–V compound semiconductor substrate, which is capable of minimizing stress occurrence during the growth of substrate to thereby protect the substrate from cracking.

To achieve the object of the present invention, there is provided a compound semiconductor substrate fabrication method comprising: preparing a base substrate; forming a first buffer layer on the prepared base substrate; forming a semiconductor layer on the first buffer layer; and removing the base substrate.

It is preferable that, between forming the semiconductor layer and removing the base substrate, the compound semiconductor substrate fabrication method further comprises forming a second buffer layer on the semiconductor layer. Preferably, the second buffer layer has the same structure as the first buffer layer. Preferably, the second buffer layer has a doping concentration profile symmetrical or asymmetrical to the first buffer layer.

Preferably, the first buffer layer is formed of multiple semiconductor material layers having different doping concentrations. In this case, forming the multiple semiconductor material layers may comprise: forming a doped semiconductor material layer on the base substrate; and forming an undoped semiconductor material layer on the doped semiconductor material layer. More preferably, on the undoped semiconductor material layer, the doped semiconductor material layer and the undoped semiconductor material layer may be alternatively formed at least one time.

Alternatively, forming the multiple semiconductor material layers may comprise: forming an undoped semiconductor material layer on the base substrate; and forming a doped semiconductor material layer on the undoped semiconductor material layer. In this case, on the doped semiconductor material layer, the undoped semiconductor material layer and the doped semiconductor material layer may be alternately formed at least one time.

In the compound semiconductor substrate fabrication method according to the present invention, preferably, the first buffer layer may be formed of a semiconductor material layer of a gradient doping concentration that increases upwards. Forming the semiconductor material layer of the gradient doping concentration that increases upwards may comprise: forming an undoped semiconductor material layer on the base substrate; and forming a doped semiconductor material layer of a gradient doping concentration that increases upwards, on the undoped semiconductor material layer. In this case, preferably, the doped semiconductor material layer of the gradient doping concentration that increases upwards comprises multiple semiconductor material layers deposited sequentially, starting with a semiconductor material layer of the lowest doping concentration.

In the compound semiconductor substrate fabrication method according to the present invention, preferably, the second buffer layer may be formed of multiple semiconductor material layers having different doping concentrations. Forming the multiple semiconductor material layers may comprise: forming a doped semiconductor material layer on the semiconductor layer; and forming an undoped semiconductor material layer on the doped semiconductor material layer. Alternatively, forming the multiple semiconductor material layers may comprise: forming an undoped semiconductor material layer on the semiconductor layer; and forming a doped semiconductor material layer on the undoped semiconductor material layer. In this case, on the doped semiconductor material layer, the undoped semiconductor material layer and the doped semiconductor material layer may be alternately formed at least one time.

Alternatively, the second buffer layer may be formed of a semiconductor material layer of a gradient doping concentration that increases upwards. In this case, forming the semiconductor material layer of the gradient doping concentration that increases upwards may comprise: forming an undoped semiconductor material layer on the semiconductor layer; and forming a doped semiconductor material layer of a gradient doping concentration that increases upwards, on the undoped semiconductor material layer.

Alternatively, the second buffer layer may be formed of a semiconductor material layer of a gradient doping concentration that decreases upwards. In this case, forming the semiconductor material layer of the gradient doping concentration that decreases upwards may comprise: forming a doped semiconductor material layer of a gradient doping concentration that decreases upwards, on the semiconductor layer; and forming a undoped semiconductor material layer on the doped semiconductor material layer. Preferably, the doped semiconductor material layer of the gradient doping concentration that decreases upwards comprises multiple semiconductor material layers deposited sequentially, starting with a semiconductor material layer of the highest doping concentration.

According to the present invention, the semiconductor layer is preferably a Group III–V compound semiconductor layer having conductivity. More preferably, the Group III–V compound semiconductor layer is a silicon-doped GaN layer.

The base substrate is treated with ammonium ($NH_3$) gas or hydrogen chloride (HCl) gas for surface passivation.

The present invention can minimize stress on a compound semiconductor substrate during growth so that a high-quality compound semiconductor substrate, for example, a GaN substrate, with reduced likelihood of cracking can be formed.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
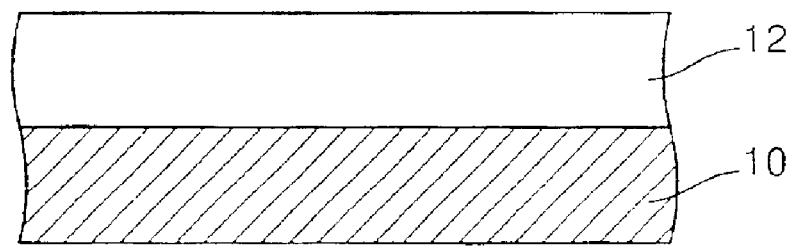
FIG. 1 is a sectional view illustrating a conventional GaN substrate fabrication method.
Figure 2:
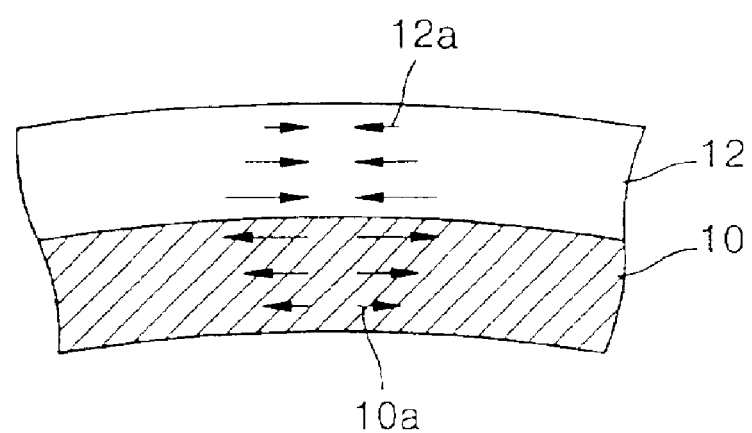
FIG. 2 is a sectional view illustrating a problem of the conventional GaN substrate fabrication method of FIG. 1.

Preferred embodiments of the present invention now will be described more fully with reference to the appended drawings. In the drawings, the thickness of layers and regions are exaggerated for clarity.

Figure 3:
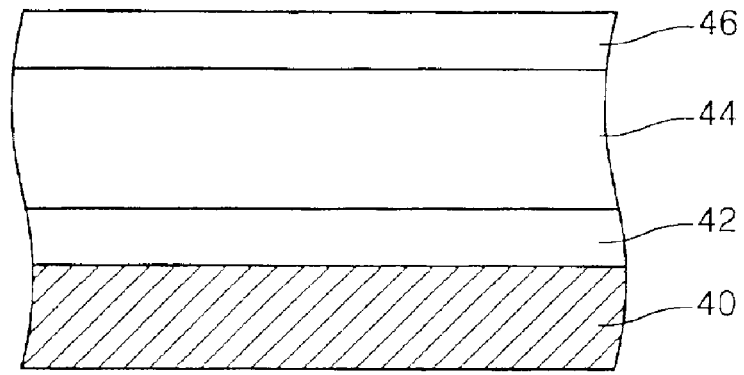
FIGS. 3 and 4 are sectional views illustrating each step of a method of Group III–V compound semiconductor substrate fabrication according to a preferred embodiment of the present invention.

Referring to FIG. 3, a first buffer layer 42 is formed on a base substrate 40 to relief stress. Before the formation of the first buffer layer 42, the surface of the base substrate 40 is treated. The base substrate 40 is formed of a sapphire substrate or a silicon carbide (SiC) substrate. Subsequently, a semiconductor layer 44 is formed on the first buffer layer 42. Here, the semiconductor layer 44 is formed as thick as possible to mask a subsequent separation from the base substrate 40 easier and minimize the growth of crystalline defects. The semiconductor layer 44 is formed of, but not limited to, a compound semiconductor layer. Alternatively, the semiconductor layer 44 may be formed of a non-compound semiconductor layer.

Hereinafter, the semiconductor layer 44 will be referred to as the compound semiconductor layer 44. However, it will be appreciated that the following description can be applied to non-compound semiconductor layers.

In forming the compound semiconductor layer 44, conductive impurity ions, such as silicon ions, are implanted into the compound semiconductor layer 44 to give conductivity. The compound semiconductor layer 44 is preferably formed of a Group III–V compound semiconductor layer, more preferably a GaN layer. A second buffer layer 46 is formed on the compound semiconductor layer 44. Formation of the second buffer layer 46 is optional, but it is preferred.

Figure 4:

After the formation of the second buffer layer 46 (or after formation of the compound semiconductor layer 44), the base substrate 40 is removed to complete formation of a conductive compound semiconductor substrate. Preferably, the first buffer layer 42 is removed until the entire surface of the compound semiconductor layer 44 is exposed, as shown in FIG. 4.

The first and second buffer layers 42 and 46 may be formed by the following methods. A variety of methods to form the first buffer layer 42 will be described first.

Method 1

Figure 5:
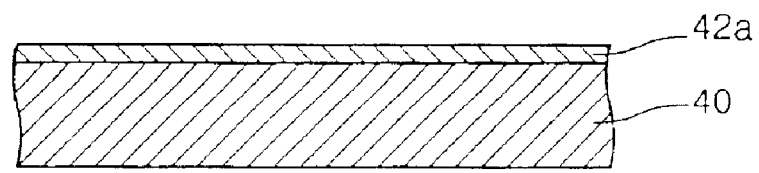
FIGS. 5 through 8 are sectional views illustrating each step of a first method of first buffer layer formation according to the Group III–V compound semiconductor substrate fabrication method of FIGS. 3 and 4.

Referring to FIG. 5, a doped compound semiconductor layer 42a (referred also to as a "first layer") is formed on a base substrate 40 to relief stress. Here, silicon may be used as the dopant.

Subsequently, an undoped compound semiconductor layer 42b (referred also to as a "second layer") is formed on the first layer 42a. The first and second layers 42a and 42b are doped and undoped Group III–V compound semiconductor layers, respectively. For example, the first layer 42a may be a silicon-doped GaN layer, and the second layer 42b may be an undoped GaN layer.

Figure 7:
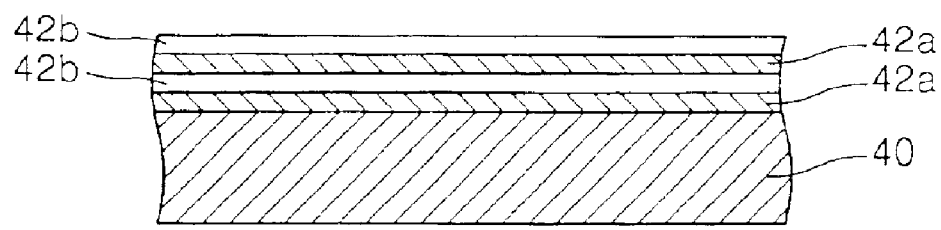
Figure 8:
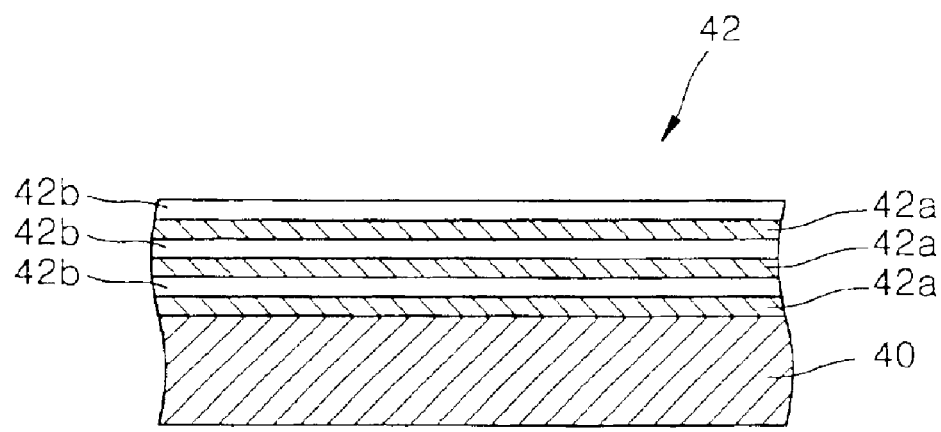

Referring to FIG. 7, on the second layer 42b, another first and second layers 42a and 42b are sequentially formed. In a similar manner, three first layers 42a and four second layers 42b are alternately formed to thereby complete formation of the first buffer layer 42, as shown in FIG. 8.

Method 2

A first buffer layer is formed in the same manner as Method 1 by alternating a plurality of first layers 42a and a plurality of second layers 42b, except that the initial order of deposition of the first and second layers 42a and 42b is inversed.

Figure 6:
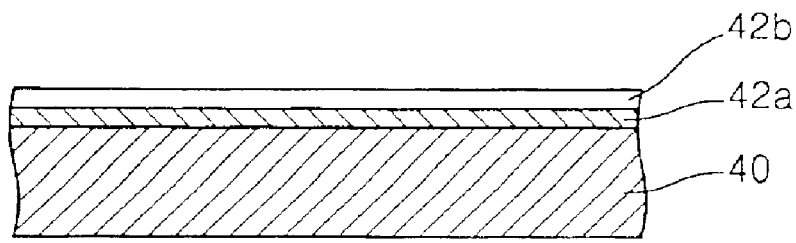
Figure 9:
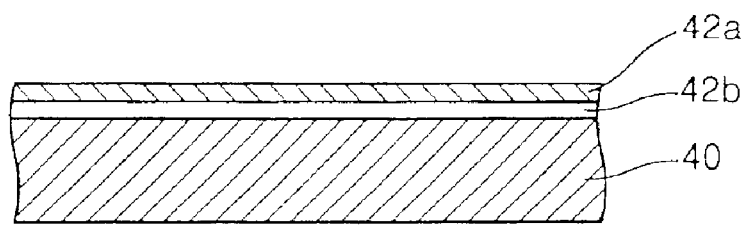
FIGS. 9 and 10 are sectional views illustrating each step of a second method of first buffer layer formation according to the Group III–V compound semiconductor substrate fabrication method of FIGS. 3 and 4.
Figure 10:
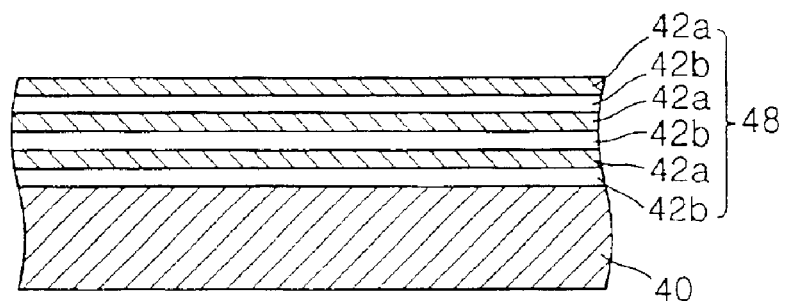

In particular, unlike Method 1 where the first layer 42a is deposited on the base substrate, as illustrated in FIGS. 5 and 6, the second layer 42b is first deposited on the base substrate 40, and then the first layer 42a is formed on the second layer 42b according to Method 2, as shown in FIG. 9. Next, as shown in FIG. 10, on the first layer 42a, another second and first layers 42b and 42a are alternately formed to thereby complete formation of a first buffer layer 48 having a different structure from the first buffer layer 42 formed using Method 1.

Method 3

Figure 11:
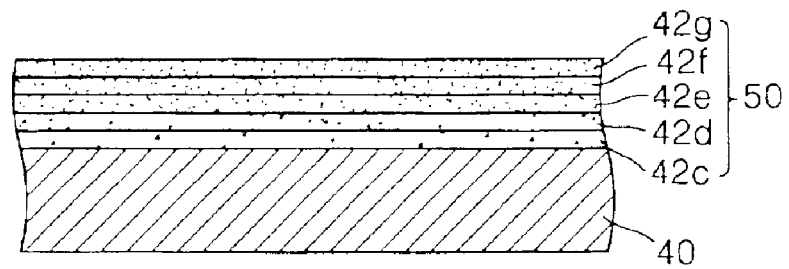
FIG. 11 is a sectional view illustrating a third method of first buffer layer formation according to the Group III–V compound semiconductor substrate fabrication method of FIGS. 3 and 4.

Referring to FIG. 11, a compound semiconductor layer 42c (referred also to as a "first doped compound semiconductor layer) of a first doping concentration is formed on the base substrate 40. Second through fifth doped compound semiconductor layers 42d, 42e, 42f, and 42g are sequentially formed on the first doped compound semiconductor layer 42c. Preferably, the first through fifth doped compound semiconductor layers 42c, 42d, 42e, 42f, and 42g have gradient doping concentrations that increase towards the uppermost layer.

Therefore, the resulting first buffer layer 50 formed using Method 3 has a gradient doping concentration that increases upwards.

Next, a variety of methods to form the second buffer layer 46 of FIG. 3 will be described.

Method 1

A second buffer layer is formed in the same manner as for the first buffer layer 42 illustrated in FIGS. 5 through 7, except that the base layer for the second buffer layer is the compound semiconductor layer 44, not the base substrate 40.

Method 2

A second buffer layer is formed in the same manner as for the first buffer layer 48 illustrated in FIGS. 9 through 10, except that the base layer for the second buffer layer is the compound semiconductor layer 44, not the base substrate 40.

Method 3

A second buffer layer is formed in the same manner as for the first buffer layer 50 illustrated in FIG. 11, except that the base layer for the second buffer layer is the compound semiconductor layer 44, not the base substrate 40. The resulting second buffer layer has the same doping concentration profile as the first buffer layer 50 of FIG. 11, so that the doping concentration profile of both the first and second buffer layers combined with the compound semiconductor layer 44 is asymmetrical.

Method 4

Figure 12:
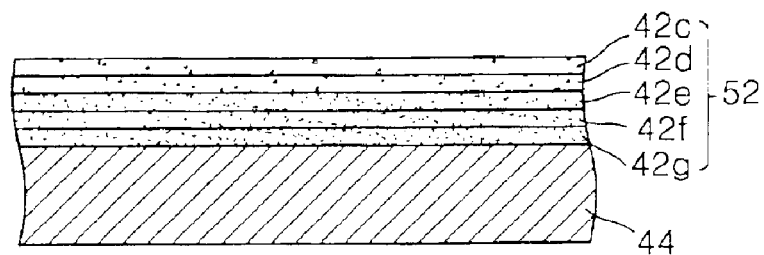
FIG. 12 is a sectional view illustrating a fourth method of second buffer layer formation according to the Group III–V compound semiconductor substrate fabrication method of FIGS. 3 and 4.

A second buffer layer is formed in the inverse order to Method 3. Referring to FIG. 12, a second buffer layer 52 including the first through fifth doped compound semiconductor layers 42c, 42d, 42e, 42f, and 42g is formed on the compound semiconductor layer 44. In Method 4, the fifth doped compound semiconductor layer 42g of the highest doping concentration is first formed on the compound semiconductor layer 44, and the fourth, third, second, and first doped compound semiconductor layers 42f, 42e, 42d, and 42c are sequentially formed. When the first buffer layer 42 is formed using Method 3 and the second buffer layer 46 of FIG. 3 is formed using Method 4, the doping concentration profiles of the first and second buffer layers 42 and 46 are symmetrical about the compound semiconductor layer 44.

The present invention will be described in greater detail by means of the following experimental examples.

EXPERIMENTAL EXAMPLE 1

The inventor experimentally fabricated a GaN substrate as a Group III–V compound semiconductor substrate. Gallium (Ga) and ammonia were used as precursors to form the GaN layer, and nitrogen ($N_2$) gas was used as a carrier gas. The GaN layer was grown using hydride vapor phase epitaxy (HVPE), and a horizontal open flow reactor was used as a growth furnace.

In particular, a sapphire substrate was loaded into the reactor, followed by surface treatment with ammonium ($NH_3$) gas and hydrogen chloride (HCl) gas. Subsequently, a silicon-doped GaN layer of a 30-$\mu$m thickness was formed as the first buffer layer 42 (see FIG. 3), and a silicon-doped GaN layer of a 250-$\mu$m thickness was formed as the compound semiconductor layer 44 (see FIG. 3). A silicon-doped GaN layer of a 20-$\mu$m thickness was formed on the 250-$\mu$m-thick silicon doped GaN layer as the second buffer layer 46 (see FIG. 3). The sapphire substrate on which the GaN layers had been grown was removed from the reactor to thereby complete formation of a crack-reduced GaN substrate over 1 hour.

The formation of the 30-$\mu$m-thick GaN layer as the first buffer layer will be described in greater detail. A silicon-doped GaN layer was first formed on the sapphire substrate to a thickness of 3 $\mu$m, and dichlorosilane ($SiH_2Cl_2$) gas was flowed over the resulting GaN layer at 1 sccm to form a 2-$\mu$m-thick silicon-doped GaN layer. This alternate deposition of the two GaN layers was repeated to form six GaN layers of a total thickness of 30-$\mu$m.

The 20-$\mu$m-thick silicon-doped GaN layer was formed of four GaN layers by alternate deposition of the two layers described above.

The 250-$\mu$m-thick GaN layer was grown at a rate of 60 $\mu$m/hour while simultaneously being doped with silicon.

EXPERIMENTAL EXAMPLE 2

The same conditions as in Experimental Example 1 were applied, but processes to form a 30-$\mu$m-thick silicon-doped GaN layer as the first buffer layer and a 20-$\mu$m-thick GaN layer as the second buffer layer were varied from Experimental Example 1.

The 30-$\mu$m-thick silicon-doped GaN layer for the first buffer layer was formed by sequentially forming five GaN layers (referred to as first through fifth GaN layers) having a 6-$\mu$m thickness each, with different doping concentrations for each layer.

In particular, the first GaN layer was formed as an undoped layer, and the second GaN layer was formed by flowing a dichlorosilane gas as a dopant source gas over the compound semiconductor layer 44 at 0.1 sccm. The third, fourth, and fifth GaN layers were formed by flowing the dichlorosilane gas at 0.2, 0.3, and 0.4 sccm, respectively. The first through fifth GaN layers, i.e., the 30 $\mu$-m-thick silicon-doped GaN layer, had gradient doping concentrations that increased towards the uppermost layer.

Like the 30-μm-thick GaN layer formed as the first buffer layer, the 20-μm-thick silicon-doped GaN layer for the second buffer layer was formed by sequentially forming on the compound semiconductor layer 44 five GaN layers (referred to as sixth through tenth GaN layers) having a 4-μm thickness each, with different doping concentrations for each layer. However, the doping concentrations of the sixth through tenth GaN layers gradually decreased towards the uppermost layer, which is opposite to the doping concentration gradient of the first through fifth GaN layers forming the first buffer layer.

In particular, the sixth GaN layer was first formed with the highest doping concentration by flowing the dichlorosilane gas over the compound semiconductor layer 44 at 0.4 sccm. Next, the seventh, eighth, and ninth GaN layers were formed by flowing the dichlorosilne gas over the compound semiconductor layer 44 at 0.3, 0.2, 0.1 sccm, respectively, so that the doping concentration of each layer was gradually decreased. The tenth GaN layer was formed as an undoped layer, followed by the same processes as in Experimental Example 1.

Figure 13:
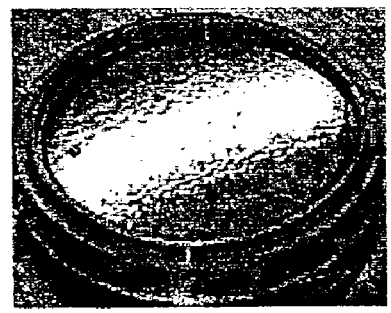
FIGS. 13 and 14 are photographs showing the topology of GaN substrates manufactured in an experimental example according to the present invention and using a conventional method, respectively, which have a 2-inch diameter and 300-$\mu$m thickness.
Figure 14:
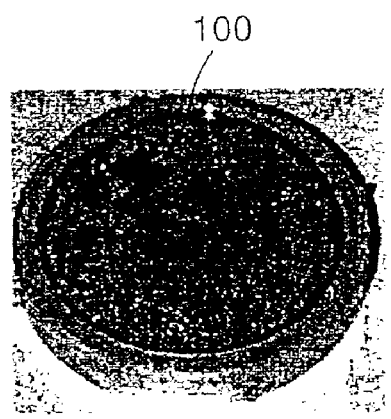

FIG. 13 is a photograph showing the topology of a GaN substrate having a 2-inch diameter and 300-μm thickness, which was experimentally manufactured using a method according to the present invention. FIG. 14 is a photograph showing the topology of a GaN substrate formed using a conventional method to have the same size and thickness as the GaN substrate of FIG. 13.

As shown in FIGS. 13 and 14, no crack is observed in the GaN substrate formed according to the present invention, whereas cracks 100 are observed in the GaN substrate formed using the conventional method.

The present invention may be embodied in many different forms, and the embodiments described herein are merely illustrative and not intended to limit the scope of the invention. For example, it will be appreciated to those skilled in the art that materials other than silicon can be used as dopants, and the spirit of the present invention of using a buffer layer can be applied to non-compound semiconductor substrates or other compound semiconductor substrates not mentioned above. In addition, a different material layer from the compound semiconductor layer 44 can be used to form the first buffer layer between the base substrate and the compound semiconductor layer 44, which is removed later together with the base substrate. Although the first buffer layer was formed by alternating a doped layer and an undoped layer in an embodiment, two layers having different doping concentrations may alternate to form the first buffer layer. Alternatively, the first buffer layer may be formed by alternating doped (undoped) and undoped (doped) semiconductor material layers, and the second buffer layer may be formed of a semiconductor material layer having a gradient doping concentration that increases or decreases towards the uppermost portion. Therefore, the spirit and scope of the present invention should be defined by the appended claims, not by the embodiments described above.

As described above, by forming a buffer layer to relief stress between a base substrate and a main substrate, i.e., a compound semiconductor layer, by forming an additional buffer layer on the compound semiconductor layer, a difference in stress between the base substrate and the compound semiconductor layer can be minimized to thereby reduce occurrence of cracks in the compound semiconductor layer. The result is a high-quality compound semiconductor substrate, such as a GaN substrate, which is a representative example of Group III–V compound semiconductor substrates.

What is claimed is:

1. A semiconductor substrate fabrication method comprising:
    preparing a base substrate;
    forming a first buffer layer on the prepared base substrate;
    forming a semiconductor layer on the first buffer layer; and
    after forming the semiconductor layer, removing the base substrate such that said semiconductor layer is a final substrate.

2. The method of claim 1, between forming the semiconductor layer and removing the base substrate, further comprising forming a second buffer layer on the semiconductor layer.

3. The method of claim 1, wherein the base substrate is formed of a sapphire substrate or a silicon carbide (SiC) substrate.

4. The method of claim 2, wherein the second buffer layer has the same structure as the first buffer layer.

5. The method of claim 2, wherein the second buffer layer has a doping concentration profile symmetrical to the first buffer layer.

6. The method of claim 2, wherein the second buffer layer has a doping concentration profile asymmetrical to the first buffer layer.

7. The method of claim 1, wherein the first buffer layer is formed of multiple semiconductor material layers having different doping concentrations.

8. The method of claim 7, wherein forming the multiple semiconductor material layers comprises:
    forming a doped semiconductor material layer on the base substrate; and
    forming an undoped semiconductor material layer on the doped semiconductor material layer.

9. The method of claim 8, further comprising on the undoped semiconductor material layer at least once alternately forming the doped semiconductor material layer and the undoped semiconductor material layer.

10. The method of claim 7, wherein forming the multiple semiconductor material layers comprises:
    forming an undoped semiconductor material layer on the base substrate; and
    forming a doped semiconductor material layer on the undoped semiconductor material layer.

11. The method of claim 10, further comprising on the doped semiconductor material layer at least once alternately forming the undoped semiconductor material layer and the doped semiconductor material layer.

12. The method of claim 1, wherein the first buffer layer is formed of a semiconductor material layer of a gradient doping concentration that increases upwards.

13. The method of claim 12, wherein forming the semiconductor material layer of the gradient doping concentration that increases upwards comprises:
    forming an undoped semiconductor material layer on the base substrate; and
    forming a doped semiconductor material layer of a gradient doping concentration that increases upwards, on the undoped semiconductor material layer.

14. The method of claim 13, wherein the doped semiconductor material layer of the gradient doping concentration that increases upwards comprises multiple semiconductor material layers deposited sequentially, starting with a semiconductor material layer of the lowest doping concentration.

15. The method of claim 2, wherein the second buffer layer is formed of multiple semiconductor material layers having different doping concentrations.

16. The method of claim 15, wherein forming the multiple semiconductor material layers comprises:
   forming a doped semiconductor material layer on the semiconductor layer; and
   forming an undoped semiconductor material layer on the doped semiconductor material layer.

17. The method of claim 16, further comprising on the undoped semiconductor material layer at least once alternately forming the doped semiconductor material layer and the undoped semiconductor material layer.

18. The method of claim 15, wherein forming the multiple semiconductor material layers comprises:
   forming an undoped semiconductor material layer on the semiconductor layer; and
   forming a doped semiconductor material layer on the undoped semiconductor material layer.

19. The method of claim 18, further comprising on the doped semiconductor material layer at least once alternately forming the undoped semiconductor material layer and the doped semiconductor material layer.

20. The method of claim 2, wherein the second buffer layer is formed of a semiconductor material layer of a gradient doping concentration that increases upwards.

21. The method of claim 20, wherein forming the semiconductor material layer of the gradient doping concentration that increases upwards comprises:
   forming an undoped semiconductor material layer on the semiconductor layer; and
   forming a doped semiconductor material layer of a gradient doping concentration that increases upwards, on the undoped semiconductor material layer.

22. The method of claim 21, wherein the doped semiconductor material layer of the gradient doping concentration that increases upwards comprises multiple semiconductor material layers deposited sequentially, starting with a semiconductor material layer of the lowest doping concentration.

23. The method of claim 2, wherein the second buffer layer is formed of a semiconductor material layer of a gradient doping concentration that decreases upwards.

24. The method of claim 23, wherein forming the semiconductor material layer of the gradient doping concentration that decreases upwards comprises:
   forming a doped semiconductor material layer of a gradient doping concentration that decreases upwards, on the semiconductor layer; and
   forming a undoped semiconductor material layer on the doped semiconductor material layer.

25. The method of claim 24, wherein the doped semiconductor material layer of the gradient doping concentration that decreases upwards comprises multiple semiconductor material layers deposited sequentially, starting with a semiconductor material layer of the highest doping concentration.

26. The method of claim 1, wherein the semiconductor layer is a Group III–V compound semiconductor layer having conductivity.

27. The method of claim 26, wherein the Group III–V compound semiconductor layer is a silicon-doped GaN layer.

28. The method of claim 4, wherein the first buffer layer is formed of multiple semiconductor material layers having different doping concentrations.

29. The method of claim 5, wherein the first buffer layer is formed of multiple semiconductor material layers having different doping concentrations.

30. The method of claim 6, wherein the first buffer layer is formed of multiple semiconductor material layers having different doping concentrations.

31. The method of claim 4, wherein the first buffer layer is formed of a semiconductor material layer of a gradient doping concentration that increases upwards.

32. The method of claim 5, wherein the first buffer layer is formed of a semiconductor material layer of a gradient doping concentration that increases upwards.

33. The method of claim 6, wherein the first buffer layer is formed of a semiconductor material layer of a gradient doping concentration that increases upwards.

34. The method of claim 2, wherein the semiconductor layer is a Group III–V compound semiconductor layer having conductivity.

35. The method of claim 15, wherein the semiconductor layer is a Group III–V compound semiconductor layer having conductivity.

36. The method of claim 16, wherein the semiconductor layer is a Group III–V compound semiconductor layer having conductivity.

37. The method of claim 18, wherein the semiconductor layer is a Group III–V compound semiconductor layer having conductivity.

38. The method of claim 20, wherein the semiconductor layer is a Group III–V compound semiconductor layer having conductivity.

39. The method of claim 23, wherein the semiconductor layer is a Group III–V compound semiconductor layer having conductivity.

40. The method of claim 24, wherein the semiconductor layer is a Group III–V compound semiconductor layer having conductivity.

* * * * *